United States Patent [19]

Harvey

[11] Patent Number: 5,753,976

[45] Date of Patent: May 19, 1998

[54] MULTI-LAYER CIRCUIT HAVING A VIA MATRIX INTERLAYER CONNECTION

[75] Inventor: Paul Marlan Harvey, Austin, Tex.

[73] Assignee: Minnesota Mining and Manufacturing Company, St. Paul, Minn.

[21] Appl. No.: 663,626

[22] Filed: Jun. 14, 1996

[51] Int. Cl.⁶ .............................. H01L 23/12; H05K 1/00; H05K 3/42
[52] U.S. Cl. ............................. 257/774; 257/70; 257/758; 257/693
[58] Field of Search ..................... 257/774, 758, 257/698, 700, 690–693

[56] References Cited

U.S. PATENT DOCUMENTS

| | | | |
|---|---|---|---|
| 4,720,915 | 1/1988 | Kennedy et al. | 29/847 |
| 5,184,210 | 2/1993 | Westbrook | 257/664 |
| 5,288,541 | 2/1994 | Blackwell et al. | 428/209 |
| 5,291,092 | 3/1994 | Higgins, III | 257/702 |
| 5,334,487 | 8/1994 | Kindl et al. | 430/312 |
| 5,355,019 | 10/1994 | Fuchs | 257/698 |
| 5,381,306 | 1/1995 | Schumacher et al. | 361/792 |
| 5,448,020 | 9/1995 | Pendse | 174/250 |
| 5,463,250 | 10/1995 | Nguyen et al. | 257/698 |
| 5,468,681 | 11/1995 | Pasch | 257/698 |
| 5,487,218 | 1/1996 | Bhatt et al. | 29/852 |
| 5,528,080 | 6/1996 | Goldstein | 257/774 |

FOREIGN PATENT DOCUMENTS

| | | | |
|---|---|---|---|
| 2 468 279 | 4/1981 | France | H05K 3/12 |
| 36 19 226 A1 | 6/1987 | Germany | H05K 1/18 |
| 01037073 | 2/1989 | Japan | H05K 1/11 |
| 01290283 | 11/1989 | Japan | H05K 1/11 |
| 94025984A1 | 11/1994 | WIPO | 257/697 |
| 96/00491 A1 | 1/1996 | WIPO | H05K 1/00 |

OTHER PUBLICATIONS

Glenn Gengel, "Quick Turn Manufacturing of Interconnect Systems Using Predrilled and Plated Via Arrays", 14 pages.

*Primary Examiner*—Tom Thomas
*Assistant Examiner*—Alexander Oscar Williams
*Attorney, Agent, or Firm*—Matthew B. McNutt

[57] ABSTRACT

An interlayer connection for electrically connecting first and second conductive elements and reducing interlayer registration requirements is disclosed. The interlayer connection includes a first layer including a first electrically conductive element, a second layer including a second electrically conductive element, and a third layer disposed between the first layer and the second layer. The third layer includes an electrically insulative portion having a matrix of immediately adjacent vias therethrough. A selected plurality of immediately adjacent vias within the matrix are disposed between the first and the second electrically conductive elements and contain electrically conductive material forming a conductive path between the first and the second electrically conductive elements.

14 Claims, 5 Drawing Sheets

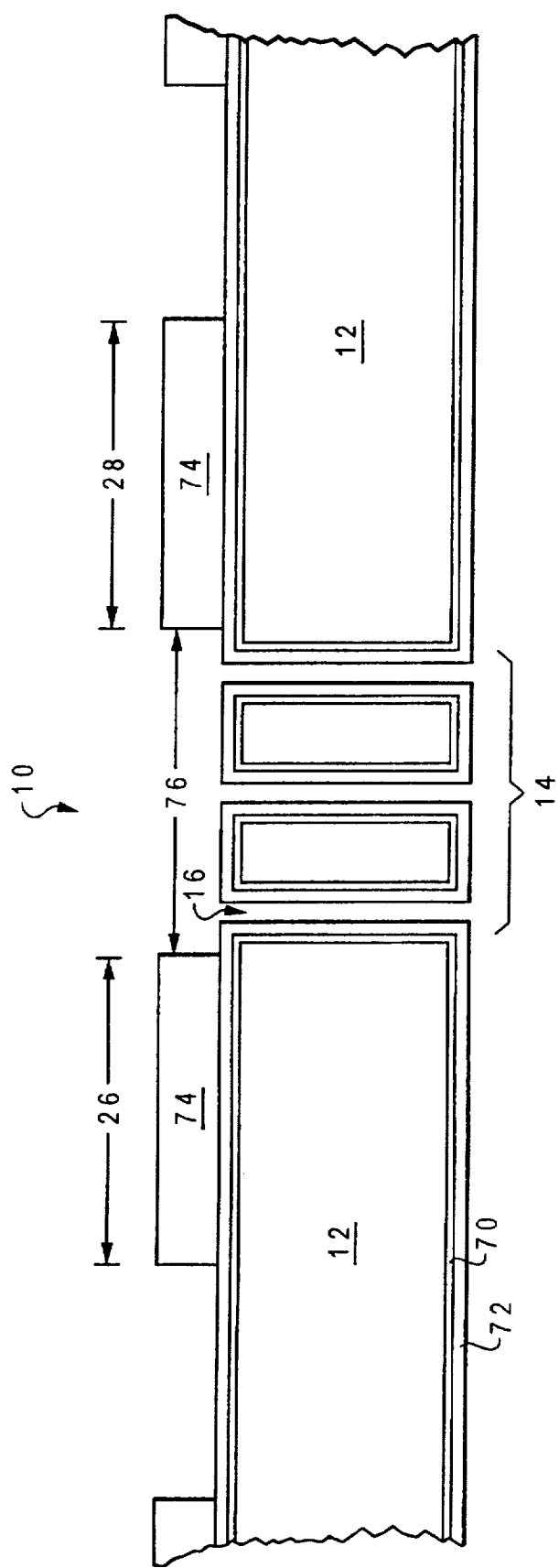

MULTI-LAYER CIRCUIT HAVING A VIA MATRIX INTERLAYER CONNECTION

BACKGROUND OF THE INVENTION

1. Technical Field

The present invention relates in general to multi-layer circuits and in particular to a multi-layer circuit having decreased interlayer registration requirements and a method for fabricating the same. Still more particularly, the present invention relates to a multi-layer flexible circuit having a via matrix interlayer connection and a method for fabricating the same.

2. Description of the Related Art

A typical state-of-the-art integrated circuit chip carrier, for example, a single chip module (SCM) or multi-chip module (MCM), includes an integrated circuit chip, which is mounted on a multi-layer flexible circuit that provides interconnections between the integrated circuit chip and other circuitry, such as other integrated circuit devices mounted on a printed circuit card to which the integrated circuit chip carrier is attached. Typically, the flexible circuit within an integrated circuit chip carrier comprises a thin, electrically insulative, flexible film formed from an organic polymeric material, such as polyimide. The flexible film serves as a substrate that supports one or more integrated circuit chips, which are each electrically connected and mechanically attached to a set of contact pads on the upper surface of the flexible film by solder balls or other similar attachment means. Each contact pad on the upper surface of the flexible film is electrically connected by a metallized circuit trace to a single metallized via extending through the flexible film. The metallized vias are in turn connected on the lower surface of the flexible film to either signal traces, which conduct electrical signals to and from the integrated circuit chip, or to a copper backplane, which provides a reference (ground) voltage or electrical power to the integrated circuit chip.

In many conventional processes for fabricating a flexible circuit, the vias are formed in the substrate subsequent to the deposition of a metal layer on at least one side of the flexible film. For example, in one conventional process, a seed layer that promotes adhesion is vapor phase deposited on the upper and lower surface of the flexible film substrate. A thin copper layer is then flash plated over the seed layer. Next, the upper and lower surfaces of the substrate are each laminated with photoresist and exposed through photomasks in order to delineate circuit traces on the upper surface of the substrate and a corresponding via pattern on the lower surface of the substrate. After the photoresist is developed, the upper surface is electroplated to form the metallized circuit traces. Next, vias are chemically etched through the flexible film at the patterned locations on the lower surface. Following the formation of the vias, the photoresist is stripped from the upper and lower surfaces and the flexible film is subjected to a number of baking and cleaning steps to prepare the vias for subsequent processing. Care must be taken to ensure that the vias are properly cleaned prior to performing further process steps in order to avoid contamination-related problems, such as blistering. A thin seed layer is then deposited on the via sidewalls and lower surface of the substrate. Thereafter, copper is plated on the via sidewalls and lower surface to form the via metallizations and copper backplane or lower surface circuitry.

Although preforming vias in the flexible film prior to metallization would be preferable in terms of streamlining the fabrication process (e.g., by permitting simultaneous metallization of the upper and lower surfaces of the substrate) and avoiding via contamination-related problems, preforming vias in the substrate prior to metallization also presents several difficulties. In particular, the flexible film undergoes a significant amount of thermal distortion due to the high temperatures associated with the vapor phase deposition of the seed layer. Heating the flexible film to such temperature extremes causes a systematic shrinkage of the flexible film in the cross-tape (transverse) direction and elongation of the flexible film in the down-tape direction. The displacement of vias resulting from the thermal distortion of the flexible film is undesirable because the subsequent photolithographic patterning of metallized traces on the upper surface of the flexible film must account for the displacement of vias in order to obtain electrical connections between the upper surface metallized traces and the flexible film backplane or lower surface signal traces. Although to some extent, the systematic thermal displacement of vias can be compensated for in the photomask utilized to pattern the metallized traces, random displacements of vias, for which a static photomask cannot compensate, are also common. Because of the random thermal displacements of vias, flexible circuits fabricated from flexible film having preformed vias can be rendered defective.

A second related problem more generally associated with the economical fabrication of state-of-the-art flexible circuits is the interlayer registration of lands, traces, and other upper surface metallizations with metallized vias and lower surface metallizations. Because of the demand for ever increasing miniaturization, especially in constrained package applications such as hearing aids and cellular telephones, registration between the circuit metallizations and metallized vias in flexible circuits must be extremely precise. To achieve satisfactory interlayer registration, the alignment of flexible circuit features such metallized traces and metallized vias can require prohibitively expensive registration equipment employing sophisticated machine vision technology.

A third problem concomitant with the fabrication of flexible circuits is the establishment of reliable connections between flexible circuit layers through the metallized vias. When fabrication processes are employed that form, but do not fill the vias prior to performing subsequent processing steps, contaminants can be entrained within the vias during plating that can subsequently cause faulty interlayer connections. Such reliability concerns are particularly prevalent when aqueous processing methods are utilized because the surface tension of aqueous cleaning agents can inhibit the wetting of vias and other high aspect ratio circuit features. Furthermore, because connections between upper and lower surface metallizations are typically established through a single via, failure of one via interconnection, for example, between a power plane or lower surface signal trace and an upper surface metallization, can result in failure of an integrated circuit chip.

As should thus be apparent, a flexible circuit for an integrated circuit chip carrier is needed which permits the fabrication of circuit features having smaller geometries and greater densities and which decreases interlayer registration requirements. In addition, a flexible circuit interlayer connection is needed that provides improved reliability.

SUMMARY OF THE INVENTION

It is therefore one object of the present invention to provide an improved multi-layer circuit.

It is another object of the present invention to provide an improved multi-layer circuit having decreased interlayer registration requirements and a method for fabricating the same.

It is yet another object of the present invention to provide an improved multi-layer flexible circuit having a via matrix interlayer connection and a method for fabricating the same.

The foregoing objects are achieved as is now described. An interlayer connection for electrically connecting first and second conductive elements and reducing interlayer registration requirements is disclosed. The interlayer connection includes a first layer including a first electrically conductive element, a second layer including a second electrically conductive element, and a third layer disposed between the first layer and the second layer. The third layer includes an electrically insulative portion having a matrix of immediately adjacent vias therethrough. A selected plurality of immediately adjacent vias within the matrix are disposed between the first and the second electrically conductive elements and contain electrically conductive material forming a conductive path between the first and the second electrically conductive elements.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 4 depicts a cross-sectional view of a flexible circuit in accordance with the present invention prior to the metallization of the vias and the upper and lower surfaces of the flexible film substrate.

DETAILED DESCRIPTION OF PREFERRED EMBODIMENT

Figure 1A:
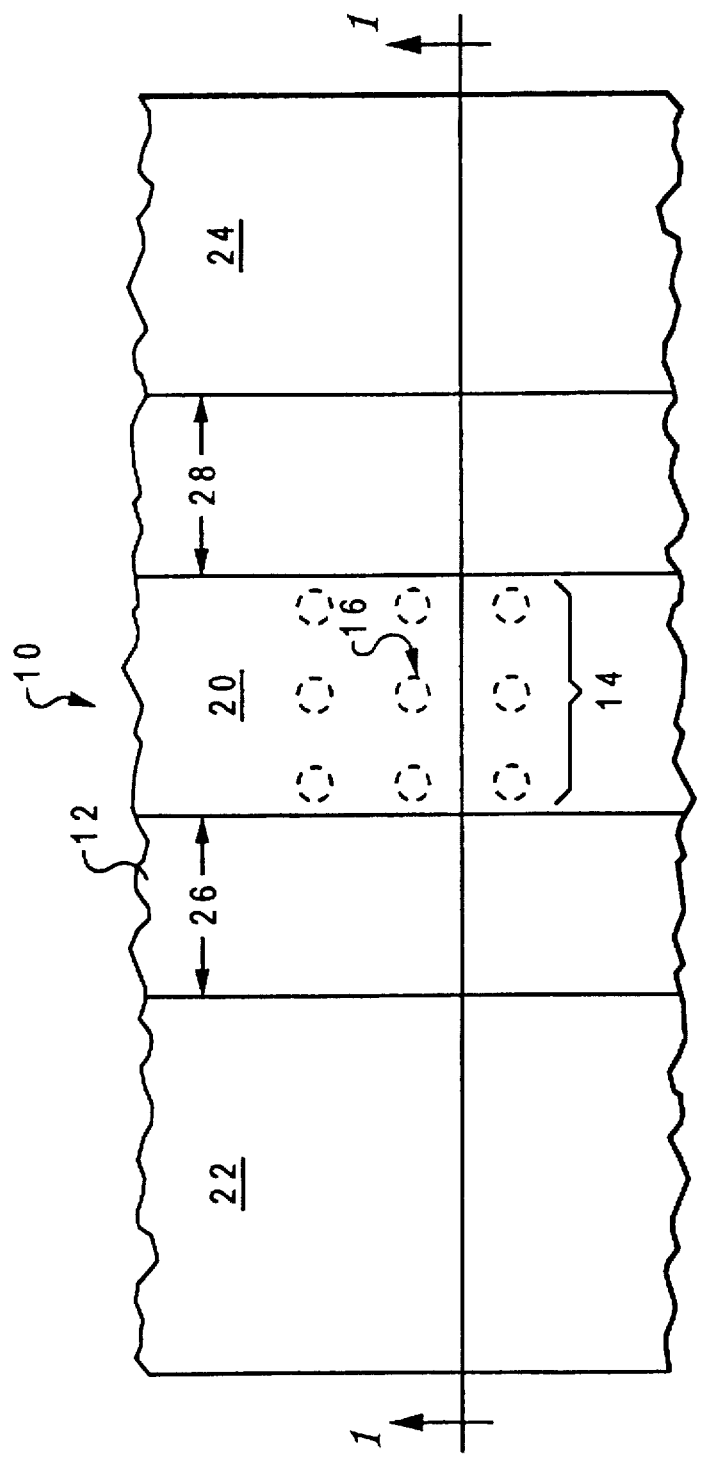
FIGS. 1A and 1B illustrate plan and cross-sectional views, respectively, of a via matrix interconnect of a flexible circuit in accordance with a first preferred embodiment of the present invention.
Figure 1B:
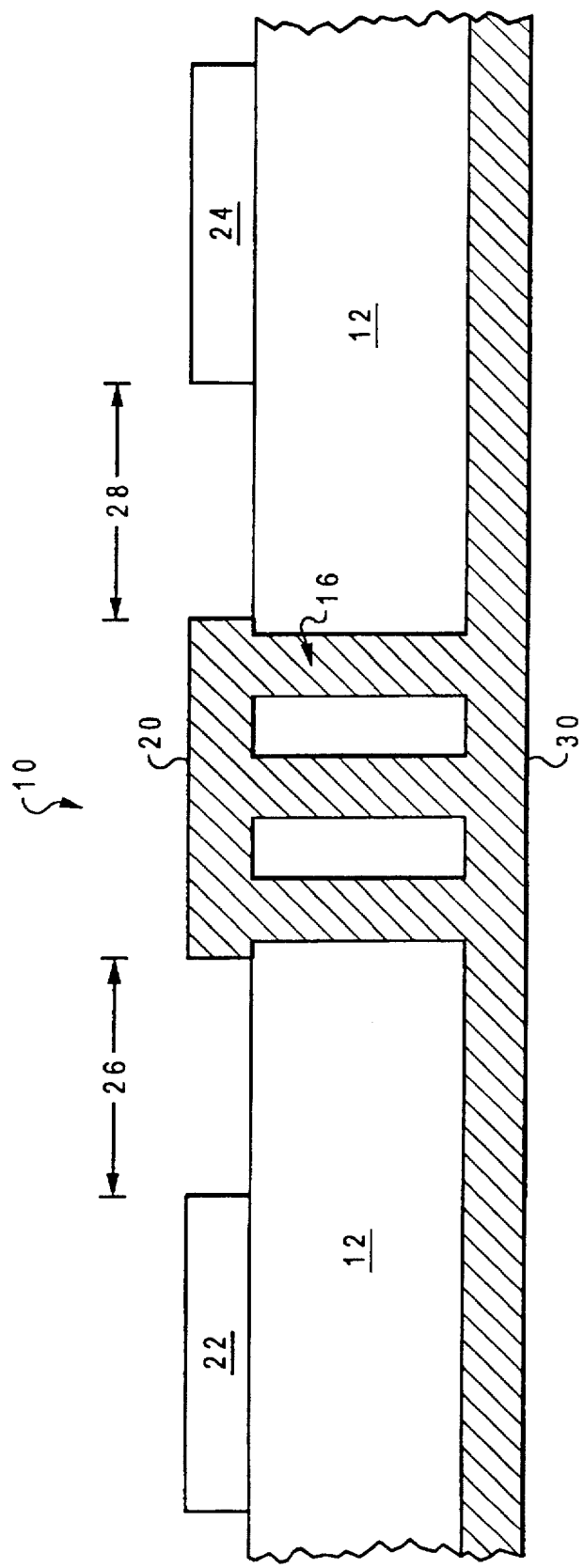

With reference now to the figures and in particular with reference to FIGS. 1A and 1B, there are illustrated plan and cross-sectional views, respectively, of a first preferred embodiment of a via matrix interlayer connection within a flexible circuit in accordance with the present invention. The cross-sectional view depicted in FIG. 1B is taken along line 1—1 of FIG. 1A. As illustrated, flexible circuit 10 includes a substrate 12, which preferably comprises a thin (e.g., 50 micron), flexible, electrically insulative organic material such a polyimide. One suitable substrate material is the polyimide sold by DuPont under the trade name Kapton E.

A via matrix 14 comprising multiple immediately adjacent vias 16 is formed through substrate 12. In accordance with the present invention, via matrix 14 can include one or more columns of vias 16 having any number of via rows in each column or one or more rows of vias 16 having any number of via columns in each row. Alternatively, via matrix 14 can include a number of vias 16 distributed in a less organized fashion within a defined area of substrate 12. Each via 16 within via matrix 14 preferably has a small diameter in comparison with vias utilized in conventional flexible circuit via interconnects. For example, each via 16 can have a diameter of between 10 and 15 microns, while vias utilized in conventional flexible circuit via interconnects have a diameter of 25–250 microns. In accordance with the present invention, a selected plurality of immediately adjacent vias 16, which in the first preferred embodiment include all vias 16 within via matrix 14, are filled with an electrically conductive material, such as copper. In contrast, nonselected vias within via matrix 14 comprise empty channels in the substrate, which do not provide an interlayer electrical connection. For the purposes of the present invention, the term immediately adjacent indicates that a perimeter bounding a set of vias does not contain any vias not included within the set.

As illustrated, flexible circuit 10 further includes metallized traces 20, 22, and 24, which in an alternative embodiment of the present invention could comprise contact pads or other circuit metallizations. As indicated by dashed-line illustration, metallized trace 20 overlays a selected plurality of immediately adjacent vias 16 within via matrix 14 in order to provide an electrical connection between metallized trace 20 and backplane 30 on the lower surface of flexible circuit 10. Backplane 30 can be utilized, for example, to supply a reference (ground) voltage or power to an integrated circuit chip (not illustrated) electrically connected to metallized trace 20. Metallized traces 22 and 24 provide signal conduction paths for input or output signals of an integrated circuit chip mounted on flexible circuit 10. Like metallized trace 20, each of metallized traces 22 and 24 is electrically connected to other circuitry by an unillustrated via matrix within substrate 12 and a contact pad on the lower surface of substrate 12.

The dimensions of via matrix 14 are preferably selected to increase (relax) interlayer registration tolerances during fabrication of flexible circuit 10. In constrained channel applications such as that illustrated in FIG. 1A, the interlayer registration tolerance of a circuit metallization with respect to a via matrix is defined as the smaller of the spacing tolerance, that is, the minimum allowable widths of channels 26 and 28, and the pad (or trace) registration tolerance, which can be stated as follows:

$$T_{PadReg} = 1/2(W_{Pad} - W_{Matrix}) + (W_{Matrix} - W_{Via})$$
$$= 1/2 W_{Pad} + 1/2 W_{Matrix} - W_{Via}, \text{ where } W \text{ is the width of the indicated circuit feature in the critical dimension of the circuit}$$

In order to maximize the interlayer registration tolerance of a circuit metallization in a constrained channel application, the dimension of via matrix 14 along the critical dimension of flexible circuit 10 is preferably selected such that the pad registration tolerance is equal to the spacing tolerance. For example, in the first preferred embodiment depicted in FIG. 1A, if the spacing tolerance is 40 microns and the width of metallized trace 20 is 50 microns, via matrix 14 can be implemented with 10 micron diameter vias at a 20 micron pitch, yielding a pad registration tolerance of 40 microns. In contrast to the present invention, conventional single via interconnections, which typically utilize vias no smaller than 25–50 microns due to reliability concerns, would have a maximum interlayer registration tolerance of $T_{PadReg} = \frac{1}{2}(W_{Pad} - W_{Via}) = 12.5$ microns. The interlayer registration tolerance enhancement achieved by the present invention in comparison to prior art single via interconnections is even more dramatic in unconstrained channel applications, in which the interlayer registration tolerance is limited only by the selected size of via matrix 14. Thus, in unconstrained channel applications, the width of via matrix 14 can be selected to be greater than the width of metallized trace 20 such that via matrix 14 covers the majority of the width and length of the channel.

A via matrix interlayer connection in accordance with the present invention has the further advantage of enhanced reliability. Although each via 16 within via matrix 14 has an intrinsically higher failure rate than a larger (25–150 micron) single via, the overall reliability of a via matrix interlayer connection in accordance with the present invention is higher than that of a conventional single via interconnection because of redundancy. Thus, for example, if the failure rate of a single via 16 is 0.1% and a connection between metallized trace 20 and backplane 30 is established through six of the nine vias 16 within via matrix 14, the predicted failure rate of the connection would be $(0.001)^6$ or $10^{-18}$. In contrast, the typical failure rate of a single 50 micron via interconnection would be approximately $10^{-5}$.

Figure 2:
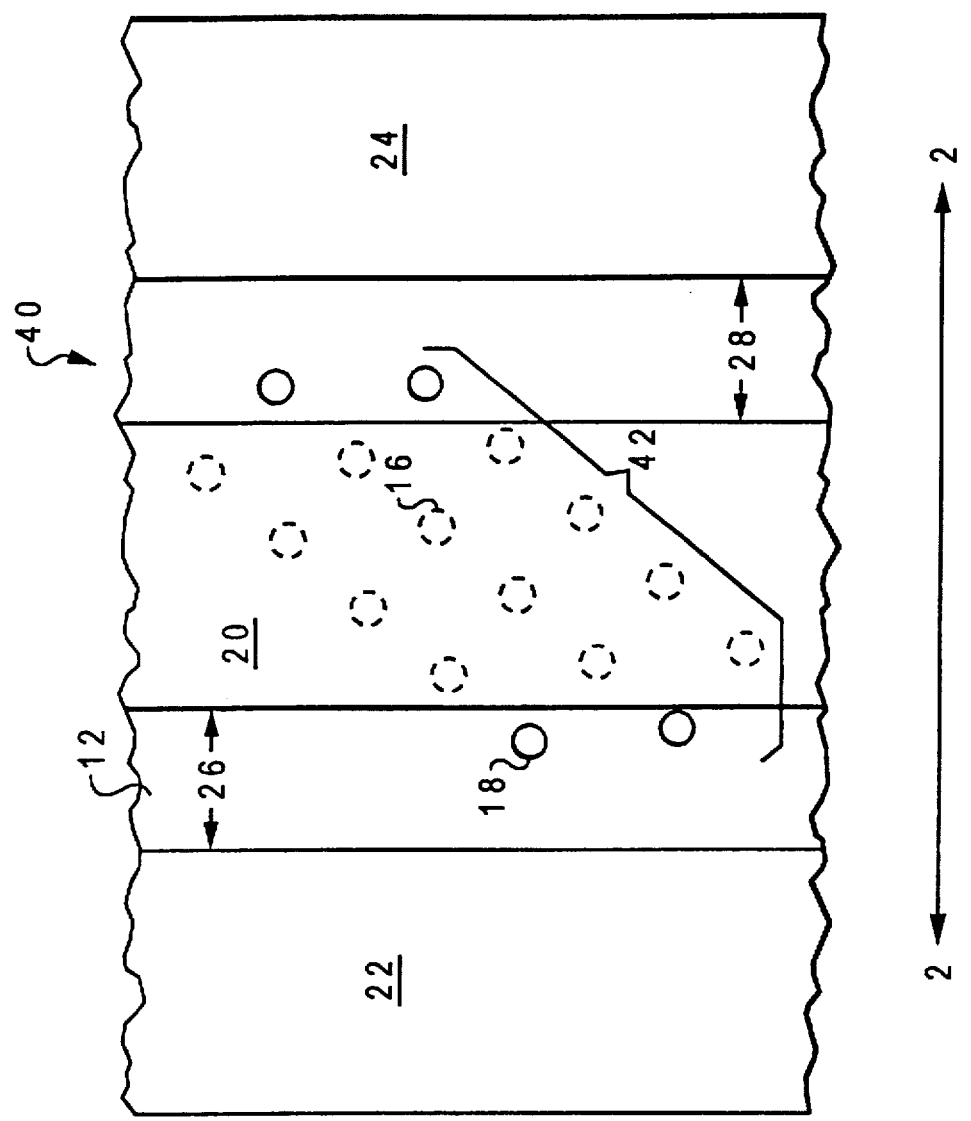
FIG. 2 depicts a second preferred embodiment of a via matrix interconnect in accordance with the present invention, wherein vias in the matrix are oriented along a non-critical dimension of the flexible circuit.

Referring now to FIG. 2, there is depicted a second preferred embodiment of a flexible circuit in accordance with the present invention in which the via matrix is oriented substantially along a non-critical dimension of the flexible circuit in order achieve greater via redundancy in a constrained channel application. In FIG. 2, like reference numerals are utilized to designate flexible circuit features corresponding to those shown in FIGS. 1A and 1B. As illustrated by the narrower widths of channels 26 and 28 between metallized trace 20 and metallized traces 22 and 24, the critical dimension of flexible circuit 40 is along line 2—2. Accordingly, via matrix 42 is oriented such that the largest dimension of via matrix 42 is substantially aligned with the noncritical dimension of metallized trace 20. Thus, by varying the orientation of via matrix 42 with respect to the width of metallized trace 20 as shown in FIG. 2, the reliability and interlayer registration tolerance of flexible circuit 40 can be increased even in applications in which circuit metallizations are tightly pitched. FIG. 2 further illustrates a number of nonselected vias 18, which as described above, comprise empty channels in substrate 12 that do not underlay metallized trace 20. Although nonselected vias 18 do not provide an interlayer electrical connection, nonselected vias 18 enhance circuit performance by decreasing mutual capacitance between metallized trace 20 and metallized traces 22 and 24.

Figure 3:
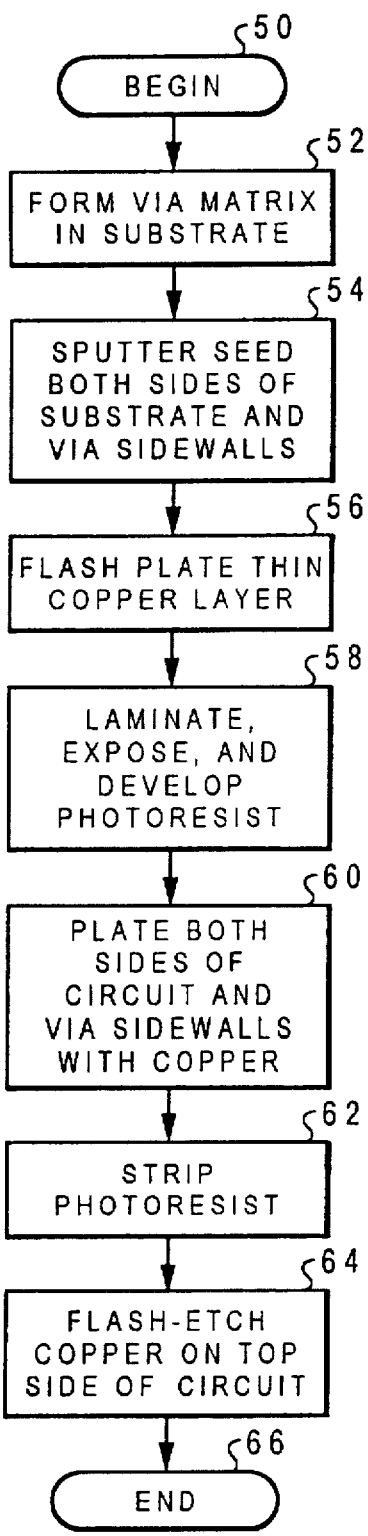
FIG. 3 illustrates a flowchart of a preferred embodiment of a method for fabricating a flexible circuit in accordance with the present invention.

With reference now to FIG. 3, there is illustrated a flowchart of a preferred embodiment of a method for fabricating a via matrix interconnection within a flexible circuit in accordance with the first preferred embodiment of the present invention illustrated in FIGS. 1A and 1B. When the process begins at block 50, a flexible film substrate material such as polyimide is preferably provided in a roll (tape) format. The process proceeds from block 50 to block 52, which illustrates forming a via matrix 14 through substrate 12 at each location at which an interconnection between a circuit metallization on the upper surface and a circuit metallization on the lower surface is desired. Via matrix 14 can be formed through substrate 12 utilizing laser drilling or any other technique that will permit small diameter (e.g., 25 micron or less) vias to be formed within substrate 12. The minimum diameter of the vias formed within substrate 12 is constrained by the maximum aspect ratio that will permit vias 16 to be reliably plated during a subsequent processing step.

The process proceeds from block 52 to block 54, which depicts utilizing vapor phase deposition (e.g., sputtering or electron beam evaporation) to form one or more thin seed layers of selected high adhesion metals, such as chromium and copper, on the upper and lower surfaces of substrate 12 and the sidewalls of vias 16. The metallized seed layers promote adhesion between subsequently deposited circuit metallizations and substrate 12. The vapor phase deposition of seed layers on the substrate typically occurs in a vacuum under high temperature and is a chief cause of the thermal displacement of vias 16 due to the concomitant thermal expansion of substrate 12.

Next, the process proceeds from block 54 to block 56, which illustrates flash plating a thin copper layer over the upper and lower surfaces of substrate 12 and the sidewalls of vias 16 in order to promote photoresist adhesion. The process then proceeds to block 58, which depicts defining metallized traces 20, 22, and 24 utilizing a standard photolithographic process. In accordance with a conventional photolithographic process, the upper surface of substrate 12 is laminated with photoresist. A photomask bearing a negative image of the desired circuit metallizations is placed in close proximity to the upper surface of substrate 12, which is then irradiated with ultraviolet light. Because of the relatively high interlayer registration tolerances permitted by the present invention, alignment of via matrix 14 and the photomask pattern corresponding to metallized trace 20 can be accomplished by manual guidance of substrate 12 alone or with optional optical sensor assistance. In either case, the proper alignment of the photomask with substrate 12 does not necessitate the use of sophisticated and expensive machine vision alignment tools. Following the exposure of the photoresist, the photoresist is chemically developed to remove photoresist from locations on substrate 12 at which metallized traces 20, 22, and 24 will be deposited.

Referring now to FIG. 4, there is depicted a cross-sectional view of flexible circuit 10 following the photoresist patterning step illustrated at block 58 of FIG. 3. As illustrated, via matrix 14 has been formed through substrate 12 as depicted at block 52 of FIG. 3. In addition, both surfaces of substrate 12 and the sidewalls of vias 16 within via matrix 14 are coated with both seed layers 70 and flash plating layer 72. Furthermore, photoresist lands 74, which are patterned at block 58 of FIG. 3, define channels 26 and 28. As will be appreciated by reference to FIG. 4, via matrix 14 increases the interlayer registration tolerance permitted during photolithography as compared to that allowed during the fabrication of conventional single-via interlayer connections because channel 76 between photoresist lands 74 can vary in position with respect to via matrix 14 to any extent that permits a single via 16 within via matrix 14 to be aligned within channel 76.

Referring again to FIG. 3, following the photoresist patterning performed at block 58, the process proceeds to block 60, which illustrates plating the upper and lower surfaces of flexible circuit 10 and the sidewalls of exposed vias 16 with copper. In addition to metallizing the exposed vias 16 within channel 76, the plating step illustrated at block 60 forms backplane 30 on the lower surface and metallized traces 20, 22, and 24 on the upper surface of flexible circuit 10. The process then proceeds to block 62, which illustrates stripping the remaining photoresist from flexible circuit 10 utilizing a stripping agent such as dilute (3–5%) potassium hydroxide (KOH). Finally, as depicted at block 64, flexible circuit 10 is subjected to flash etching utilizing a chemical etchant such as ammonium persulfate $((NH_4)_2S_2O_3)$ in order to remove the thin copper plating and sputtered seed layers from the exposed portions of the upper surface of substrate 12 and any exposed vias 16 not utilized to interconnect metallized trace 20 and backplane 30. Flash etching renders the exposed vias 16 nonconductive. Thereafter, the process terminates at block 66. Following finishing operations to complete the fabrication of flexible circuit 10, one or more integrated circuit chips are readily mounted on flexible circuit 10 and electrically connected to metallized traces 20, 22, and 24 using, for example, solder balls or wire bonds. The resulting integrated circuit device can comprise, for example, a single chip module or multi-chip module.

As has been described, the present invention provides an improved interlayer connection for use within multi-layer circuits, which enhances interlayer registration tolerances. In addition, an interlayer connection in accordance with the present invention provides improved reliability by establishing redundant electrical connections through multiple vias in a via matrix. Furthermore, reliability of the interlayer connection is enhanced by forming and filling selected vias within the via matrix prior to performing any wet processing steps of the fabrication process.

Although the present invention has been described with respect to preferred embodiments of a flexible circuit within an integrated circuit chip carrier, those skilled in the art will appreciate that the present invention may also be applied to other circuits. Furthermore, although a preferred embodiment of a method for fabricating a flexible circuit interconnect structure in accordance with the present invention has been described, those skilled in the art will appreciate that other processing methods can be employed. For example, a via matrix in accordance with the present invention can be formed within the substrate following metallization. In addition, an aqueous fabrication process, such as that described in U.S. Pat. No. 5,227,008 could alternatively be employed.

While the invention has been particularly shown and described with reference to a preferred embodiment, it will be understood by those skilled in the art that various changes in form and detail may be made therein without departing from the spirit and scope of the invention.

What is claimed is:

1. An interlayer connection for electrically connecting first and second conductive elements and reducing interlayer registration requirements, comprising:

a first layer including a first electrically conductive element;

a second layer including a second electrically conductive element; and a third layer disposed between said first and said second layer, said third layer including a flexible electrically insulative portion having a matrix of immediately adjacent vias therethrough, wherein a plurality of immediately adjacent vias within said matrix are disposed between said first and said second electrically conductive elements and contain electrically conductive material forming a conductive path between said first and said second electrically conductive elements.

2. The interlayer connection of claim 1, wherein a particular dimension of said second electrically conductive element has a selected width, and wherein a width of said matrix along said particular dimension of said second electrically conductive element is less than said selected width.

3. The interlayer connection of claim 1, wherein a particular dimension of said second electrically conductive element has a selected width, and wherein a width of said matrix along said particular dimension of said second electrically conductive element is greater than said selected width.

4. The interlayer connection of claim 3, wherein only said plurality of immediately adjacent vias disposed between said first and said second electrically conductive elements contain electrically conductive material.

5. The interlayer connection of claim 1, wherein each via within said matrix has a nominal diameter of less than 25 microns.

6. The interlayer connection of claim 1, wherein at least one of said first and said second electrically conductive elements comprises a signal trace.

7. The interlayer connection of claim 1, wherein at least one of said first and said second electrically conductive elements comprises a power or ground plane.

8. An integrated circuit device, comprising:

an integrated circuit chip;

a circuit to which said integrated circuit chip is mechanically attached and electrically connected, said circuit including:

a first layer including a first electrically conductive element;

a second layer including a second electrically conductive element; and a third layer disposed between said first and said second layer, said third layer including a flexible electrically insulative portion having a matrix of immediately adjacent vias therethrough, wherein a plurality of immediately adjacent vias within said matrix are disposed between said first and said second electrically conductive elements and contain electrically conductive material forming a conductive path between said first and said second electrically conductive elements.

9. The integrated circuit device of claim 8, wherein a particular dimension of said second electrically conductive element has a selected width, and wherein a width of said matrix along said particular dimension of said second electrically conductive element is less than said selected width.

10. The integrated circuit device of claim 8, wherein a particular dimension of said second electrically conductive element has a selected width, and wherein a width of said matrix along said particular dimension of said second electrically conductive element is greater than said selected width.

11. The integrated circuit device of claim 10, wherein only said plurality of immediately adjacent vias disposed between said first and said second electrically conductive elements contain electrically conductive material.

12. The integrated circuit device of claim 8, wherein each via within said matrix has a nominal diameter of less than 25 microns.

13. The integrated circuit device of claim 8, wherein at least one of said first and said second electrically conductive elements comprises a signal trace.

14. The integrated circuit device of claim 8, wherein at least one of said first and said second electrically conductive elements comprises a power or ground plane.

* * * * *